US 9,865,835 B2

(12) United States Patent
Shinjo et al.

(10) Patent No.: US 9,865,835 B2
(45) Date of Patent: Jan. 9, 2018

(54) ORGANIC ELECTROLUMINESCENT DEVICE, ILLUMINATION APPARATUS, AND ILLUMINATION SYSTEM

(71) Applicant: Kabushiki Kaisha Toshiba, Minato-ku (JP)

(72) Inventors: Yasushi Shinjo, Kawasaki (JP); Tomoaki Sawabe, Sumida (JP); Akio Amano, Machida (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 77 days.

(21) Appl. No.: 14/814,019

(22) Filed: Jul. 30, 2015

(65) Prior Publication Data

US 2015/0340642 A1   Nov. 26, 2015

Related U.S. Application Data

(63) Continuation of application No. PCT/JP2013/078227, filed on Oct. 17, 2013.

(30) Foreign Application Priority Data

Feb. 4, 2013   (JP) ................. 2013-019966

(51) Int. Cl.
*H01L 51/52*   (2006.01)
*H01L 27/32*   (2006.01)
*H01L 51/00*   (2006.01)

(52) U.S. Cl.
CPC ...... *H01L 51/5225* (2013.01); *H01L 27/3204* (2013.01); *H01L 51/5209* (2013.01);
(Continued)

(58) Field of Classification Search
CPC combination set(s) only.
See application file for complete search history.

(56) References Cited

U.S. PATENT DOCUMENTS 6,486,601 B1   11/2002   Sakai et al.
8,841,656 B2   9/2014   Sugizaki et al.
(Continued)

FOREIGN PATENT DOCUMENTS

JP   2003-272849 A   9/2003
JP   2003-332066 A   11/2003
(Continued)

OTHER PUBLICATIONS

International Search Report dated Jan. 21, 2014 for PCT/JP2013/078227 filed Oct. 17, 2013 with English Translation.
International Written Opinion dated Jan. 21, 2014 for PCT/JP2013/078227 filed Oct. 17, 2013.

*Primary Examiner* — Kyoung Lee
*Assistant Examiner* — Ratisha Mehta
(74) *Attorney, Agent, or Firm* — Oblon, McClelland, Maier & Neustadt, L.L.P.

(57) ABSTRACT

An organic electroluminescent device includes first and second substrates, first and second electrodes, an insulating layer, an organic light emitting layer, and an intermediate layer. The first electrode is provided on the first substrate. The insulating layer is provided on the first electrode. The insulating layer includes first and second openings. The second electrode includes first and second conductive parts. The first conductive part covers the first opening. The second conductive part covers the second opening. The organic light emitting layer includes first and second light emitting parts. The first light emitting part is provided between the first electrode and the first conductive part. The second light emitting part is provided between the first electrode and the second conductive part. The second substrate is provided on a stacked body including above. The intermediate layer is provided between the stacked body and the second substrate.

17 Claims, 7 Drawing Sheets

(52) U.S. Cl.
CPC ...... *H01L 51/5221* (2013.01); *H01L 51/5234* (2013.01); *H01L 51/0085* (2013.01); *H01L 51/5212* (2013.01); *H01L 51/5237* (2013.01); *H01L 51/5259* (2013.01); *H01L 2251/5361* (2013.01)

(56) References Cited

U.S. PATENT DOCUMENTS

| | | |
|---|---|---|
| 8,853,936 B2 | 10/2014 | Sugizaki et al. |
| 8,902,383 B2 | 12/2014 | Sugi et al. |
| 8,963,414 B2 | 2/2015 | Sawabe et al. |
| 2003/0209707 A1 | 11/2003 | Tsuchiya |
| 2006/0071968 A1* | 4/2006 | Kawase ................ B41J 2/2103 347/40 |
| 2009/0267059 A1* | 10/2009 | Park .................... H01L 27/3223 257/40 |
| 2010/0154861 A1* | 6/2010 | Gritters ............... H01L 31/0352 136/246 |
| 2012/0248467 A1 | 10/2012 | Yokoyama et al. |
| 2013/0015489 A1* | 1/2013 | Song .................... H01L 51/5004 257/99 |
| 2013/0101755 A1* | 4/2013 | Lee .................. G02F 1/133707 428/1.23 |
| 2014/0140047 A1 | 5/2014 | Sawabe et al. |

FOREIGN PATENT DOCUMENTS

| | | |
|---|---|---|
| JP | 2005-050706 A | 2/2005 |
| JP | 2007-141646 A | 6/2007 |
| JP | 2008-027784 A | 2/2008 |
| JP | 2008-235664 A | 10/2008 |
| JP | 2012-216495 A | 11/2008 |
| JP | 2011-026521 A | 2/2011 |
| JP | 2011-060680 A | 3/2011 |
| JP | 2011-082098 A | 4/2011 |
| JP | 2011-249541 A | 12/2011 |
| JP | 2011-249541 A | 12/2011 |
| JP | 2012-248542 A | 12/2012 |
| WO | WO 2008-075720 A | 6/2008 |

\* cited by examiner

ORGANIC ELECTROLUMINESCENT DEVICE, ILLUMINATION APPARATUS, AND ILLUMINATION SYSTEM

CROSS-REFERENCE TO RELATED APPLICATIONS

This is a continuation application of International Application PCT/JP2013/078227, filed on Oct. 17, 2013; the entire contents of which are incorporated herein by reference.

FIELD

Embodiments described herein relate generally to an organic electroluminescent device, an illumination apparatus, and an illumination system.

BACKGROUND

There is an organic electroluminescent device that includes a light transmissive first electrode, a light reflective second electrode, and an organic light emitting layer provided between the first electrode and the second electrode. There is an illumination apparatus using the organic electroluminescent device as a light source. There is an illumination system that includes a plurality of organic electroluminescent devices and a controller configured to control to turn-on and turn-off the plurality of organic electroluminescent devices. The organic electroluminescent device is caused to have light permeability in a turn-off state by using a thin-line shaped second electrode, in which a plurality of openings are provided. In such an organic electroluminescent device, it is desired to suppress the infiltration of moisture and the like into an organic light emitting layer.

DETAILED DESCRIPTION

Figure 1:
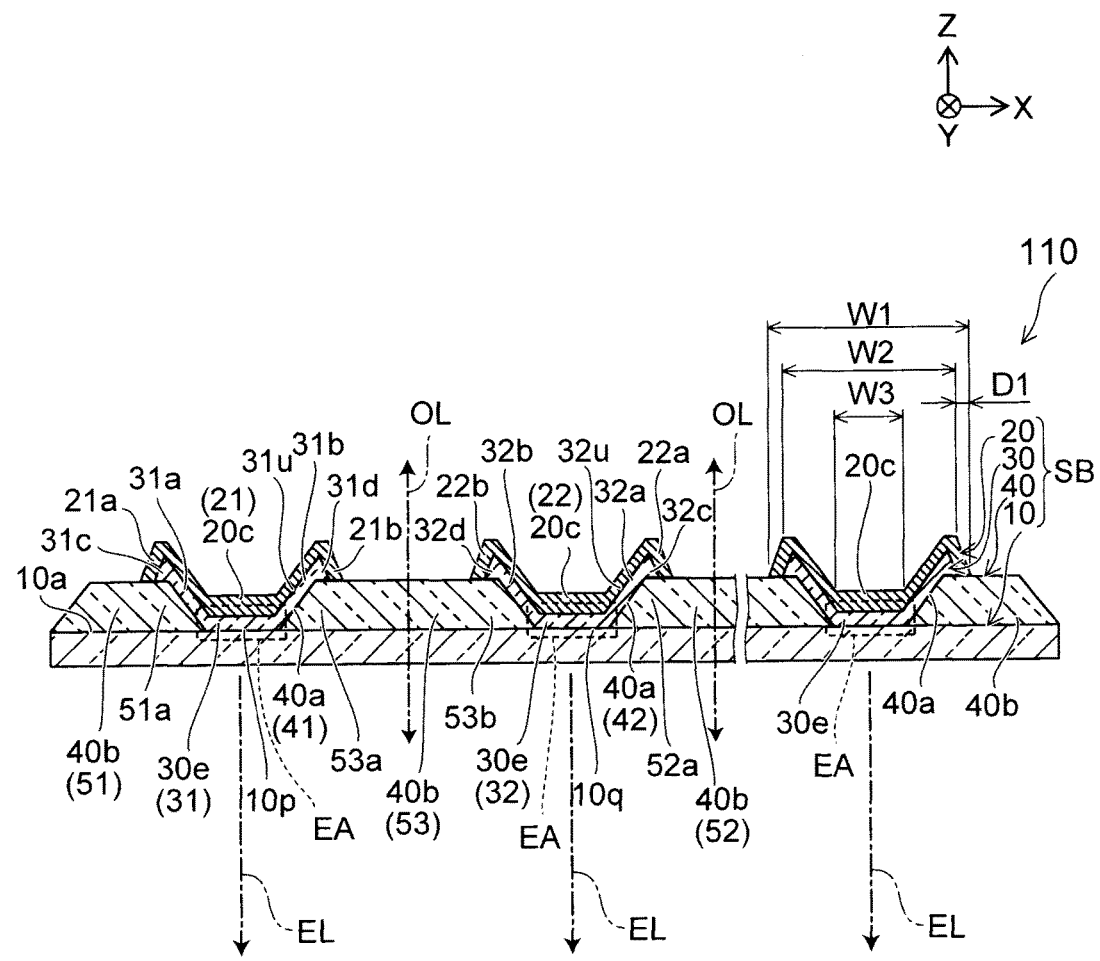
FIG. 1 is a schematic cross-sectional view showing an organic electroluminescent device according to a first embodiment.

According to one embodiment, an organic electroluminescent device includes a first substrate, a first electrode, an insulating layer, a second electrode, an organic light emitting layer, a second substrate, and an intermediate layer. The first substrate has light permeability. The first electrode is provided on the first substrate. The first electrode has light permeability. The insulating layer is provided on the first electrode. The insulating layer includes a first opening for exposing a part of the first electrode and a second opening for exposing another part of the first electrode. The insulating layer has light permeability. The second electrode includes a first conductive part and a second conductive part. The first conductive part covers the first opening. The second conductive part is spaced apart from the first conductive part and covers the second opening. The organic light emitting layer includes a first light emitting part and a second light emitting part. The first light emitting part is provided between the part of the first electrode and the first conductive part and is surrounded by the first electrode, the insulating layer, and the first conductive part. The second light emitting part is spaced apart from the first light emitting part, is provided between the another part of the first electrode and the second conductive part, and is surrounded by the first electrode, the insulating layer, and the second conductive part. The second substrate is provided on a stacked body. The stacked body includes the first electrode, the insulating layer, the organic light emitting layer, and the second electrode. The second substrate faces the first substrate. The second substrate has light permeability. The intermediate layer is provided between the stacked body and the second substrate. The intermediate layer has at least one of hygroscopicity and oxygen adsorptivity. The intermediate layer has light permeability.

According to another embodiment, an illumination apparatus includes an organic electroluminescent device and a power source. The organic electroluminescent device includes a first substrate, a first electrode, an insulating layer, a second electrode, an organic light emitting layer, a second substrate, and an intermediate layer. The first substrate has light permeability. The first electrode is provided on the first substrate. The first electrode has light permeability. The insulating layer is provided on the first electrode. The insulating layer includes a first opening for exposing a part of the first electrode and a second opening for exposing another part of the first electrode. The insulating layer has light permeability. The second electrode includes a first conductive part and a second conductive part. The first conductive part covers the first opening. The second conductive part is spaced apart from the first conductive part and covers the second opening. The organic light emitting layer includes a first light emitting part and a second light emitting part. The first light emitting part is provided between the part of the first electrode and the first conductive part and is surrounded by the first electrode, the insulating layer, and the first conductive part. The second light emitting part is spaced apart from the first light emitting part, is provided between the another part of the first electrode and the second conductive part, and is surrounded by the first electrode, the insulating layer, and the second conductive part. The second substrate is provided on a stacked body. The stacked body includes the first electrode, the insulating layer, the organic light emitting layer, and the second electrode. The second substrate faces the first substrate. The second substrate has light permeability. The intermediate layer is provided between the stacked body and the second substrate. The intermediate layer has at least one of hygroscopicity and oxygen adsorptivity. The intermediate layer has light permeability. The power source is electrically connected to the first electrode and the second electrode and supplies an electric current to the organic light emitting layer through the first electrode and the second electrode.

According to another embodiment, an illumination system includes a plurality of organic electroluminescent devices and a controller. Each of the organic electroluminescent devices includes a first substrate, a first electrode, an insulating layer, a second electrode, an organic light emitting layer, a second substrate, and an intermediate layer. The first substrate has light permeability. The first electrode is provided on the first substrate. The first electrode has light permeability. The insulating layer is provided on the first electrode. The insulating layer includes a first opening for exposing a part of the first electrode and a second opening for exposing another part of the first electrode. The insulating layer has light permeability. The second electrode includes a first conductive part and a second conductive part. The first conductive part covers the first opening. The second conductive part is spaced apart from the first conductive part and covers the second opening. The organic light emitting layer includes a first light emitting part and a second light emitting part. The first light emitting part is provided between the part of the first electrode and the first conductive part and is surrounded by the first electrode, the insulating layer, and the first conductive part. The second light emitting part is spaced apart from the first light emitting part, is provided between the another part of the first electrode and the second conductive part, and is surrounded by the first electrode, the insulating layer, and the second conductive part. The second substrate is provided on a stacked body. The stacked body includes the first electrode, the insulating layer, the organic light emitting layer, and the second electrode. The second substrate faces the first substrate. The second substrate has light permeability. The intermediate layer is provided between the stacked body and the second substrate. The intermediate layer has at least one of hygroscopicity and oxygen adsorptivity. The intermediate layer has light permeability. The controller is electrically connected to each of the organic electroluminescent devices and controls to turn-on and turn-off each of the organic electroluminescent devices.

Various embodiments will be described hereinafter with reference to the accompanying drawings.

The drawings are schematic or conceptual; and the relationships between the thicknesses and the widths of portions, the proportions of sizes between portions, etc., are not necessarily the same as the actual values thereof. Also, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

(First Embodiment)

FIG. 1 is a schematic cross-sectional view showing an organic electroluminescent device according to a first embodiment.

Figure 2:
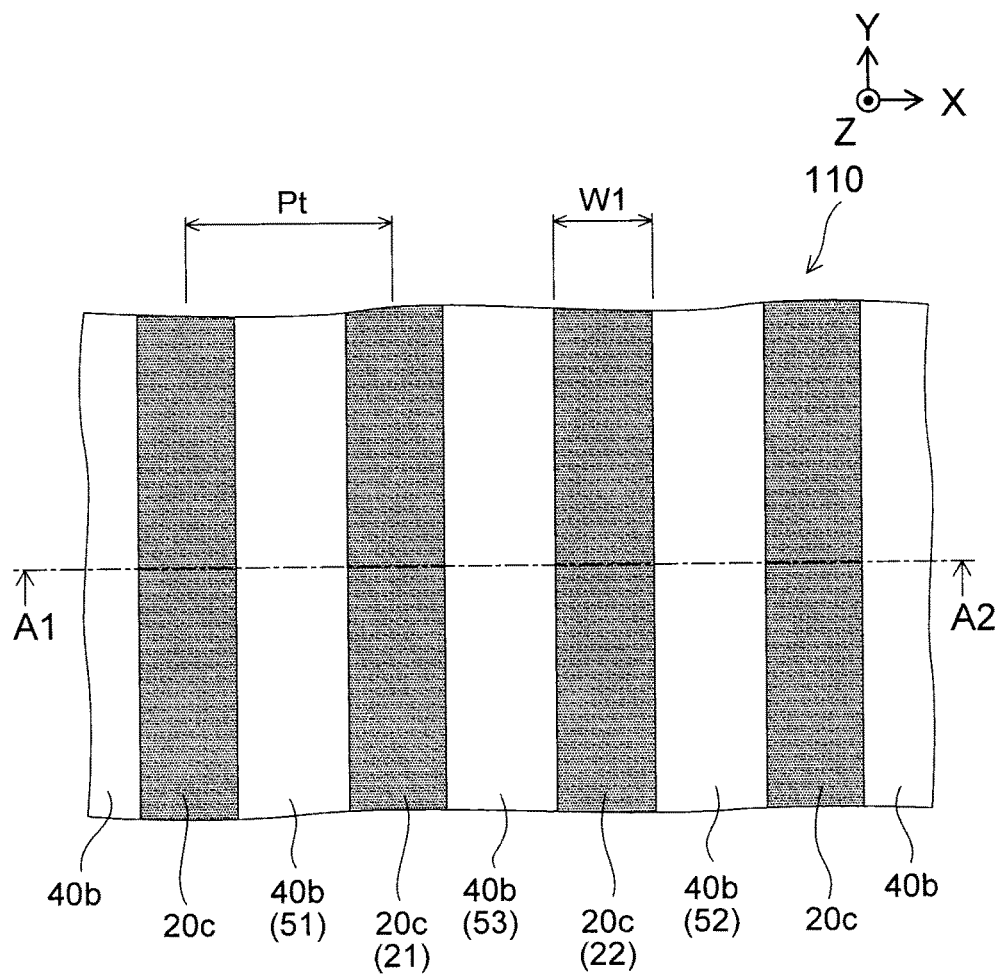
FIG. 2 is a schematic plan view showing the organic electroluminescent device according to the first embodiment.

FIG. 2 is a schematic plan view showing the organic electroluminescent device according to the first embodiment.

FIG. 1 is the cross-sectional view along an A1-A2 line of FIG. 2. These views enlarge and illustrate a part of the organic electroluminescent device according to the embodiment.

As shown in FIG. 1 and FIG. 2, an organic electroluminescent device 110 includes a stacked body SB. The stacked body SB includes a first electrode 10, a second electrode 20, an organic light emitting layer 30, and an insulating layer 40.

The first electrode 10 has an upper face 10a. The first electrode 10 has light permeability. The first electrode 10 is a transparent electrode, for example.

Here, the direction perpendicular to the upper face 10a is defined as a Z-axis direction. One direction parallel to the upper face 10a is defined as an X-axis direction. The direction perpendicular to the X-axis direction and Z-axis direction is defined as a Y-axis direction. The X-axis direction and Y-axis direction are the directions perpendicular to the Z-axis direction. The Z-axis direction corresponds to the thickness direction of the first electrode 10.

The insulating layer 40 is light transmissive. The insulating layer 40 is transparent, for example. The insulating layer 40 is provided on the upper face 10a of the first electrode 10. The insulating layer 40 includes a plurality of openings 40a and a plurality of insulating parts 40b. Each of the plurality of insulating parts 40b extends in a first direction, and is arranged in a second direction perpendicular to the first direction. In this example, each of the plurality of insulating parts 40b extends in the Y-axis direction, and is arranged in the X-axis direction. Each of the plurality of openings 40a is disposed between each of the plurality of insulating parts 40b. In this example, each of the plurality of openings 40a extends in the Y-axis direction. That is, in this example, each of the plurality of openings 40a is groove-shaped. Each of the plurality of openings 40a exposes a part of the first electrode 10.

The organic light emitting layer 30 includes a plurality of light emitting parts 30e. Each of the plurality of light emitting parts 30e is provided on a part of the first electrode 10 exposed by each of the plurality of openings 40a. Each of the plurality of light emitting parts 30e is spaced apart from each other. In this example, each of the plurality of light emitting parts 30e extends in the Y-axis direction along the opening 40a, and is spaced apart from each other in the X-axis direction.

The second electrode 20 includes a plurality of conductive parts 20c. Each of the plurality of conductive parts 20c is provided on each of the plurality of light emitting parts 30e, and covers each of the plurality of light emitting parts 30e. Each of the plurality of conductive parts 20c is spaced apart from each other. In this example, each of the plurality of conductive parts 20c extends in the Y-axis direction along the light emitting part 30e, and is spaced apart from each other in the X-axis direction. In this example, the second electrode 20, organic light emitting layer 30, and insulating layer 40 are stripe-shaped.

Each of the plurality of conductive parts 20c covers each of the plurality of openings 40a. Each of the plurality of light emitting parts 30e is provided between each of the plurality of exposed portions of the first electrode 10 and each of the plurality of conductive parts 20c, and is surrounded by the first electrode 10, the insulating layer 40, and the conductive part 20c.

The second electrode 20 (conductive part 20c) has light reflectivity, for example. The light reflectance of the second electrode 20 is higher than the light reflectance of the first electrode 10. In the specification, a state having a light reflectance higher than the light reflectance of the first electrode 10 is referred to "light-reflective".

In each of the plurality of conductive parts 20c, a part of the conductive part 20c extends onto a part of the insulating layer 40. In each of the plurality of light emitting parts 30e, a part of the light emitting part 30e extends between a part of the insulating layer 40 and a part of the conductive part 20c. Each of the plurality of light emitting parts 30e has an outer edge covered with a part of the conductive part 20c on a part of the insulating layer 40.

The width in the X-axis direction of the insulating part 40b decreases in a direction from the first electrode 10 to the second electrode 20, for example. The width in the X-axis direction of the insulating part 40b continuously decreases, for example. That is, a pair of side surfaces extending in the Y-axis direction of the insulating part 40b are tapered surfaces. As a result, for example, the generation of a crack in a part of the light emitting part 30e extending onto a part of the insulating layer 40 and/or a crack in a part of the conductive part 20c can be suppressed.

Here, one of the adjacent two openings 40a is referred to as a first opening 41. The other one of the adjacent two openings 40a is referred to as a second opening 42. The first opening 41 exposes a part 10p of the first electrode 10. The second opening 42 exposes another part 10q of the first electrode 10.

Among the plurality of light emitting parts 30e, one light emitting part 30e provided on the part 10p of the first electrode 10 is referred to as a first light emitting part 31. Among the plurality of light emitting parts 30e, one light emitting part 30e provided on another part 10q of the first electrode 10 is referred to as a second light emitting part 32.

Among the plurality of conductive parts 20c, one conductive part 20c provided on the first light emitting part 31 is referred to as a first conductive part 21. Among the plurality of conductive parts 20c, one conductive part 20c provided on the second light emitting part 32 is referred to as a second conductive part 21.

The first conductive part 21 covers the first light emitting part 31. The first conductive part 21 covers an upper face 31u that faces a side opposite the first electrode 10 of the first light emitting part 31, for example. The second conductive part 22 covers the second light emitting part 32. The second conductive part 22 covers an upper face 32u that faces a side opposite the first electrode 10 of the second light emitting part 32, for example.

The first conductive part 21 covers the first opening 41. The second conductive part 22 is spaced apart from the first conductive part 21, and covers the second opening 42. The first light emitting part 31 is provided between the part 10p of the first electrode 10 and the first conductive part 21, and is surrounded by the first electrode 10, the insulating layer 40, and the first conductive part 21. The second light emitting part 32 is provided between another part 10q of the first electrode 10 and the second conductive part 22, and is surrounded by the first electrode 10, the insulating layer 40, and the second conductive part 22.

One of the plurality of insulating parts 40b is referred to as a first insulating part 51. Another one of the plurality of insulating parts 40b is referred to as a second insulating part 52. Among the plurality of insulating parts 40b, the insulating part 40b disposed between the first insulating part 51 and the second insulating part 52 is referred to as a third insulating part 53. The first opening 41 is disposed between the first insulating part 51 and the second insulating part 52. The second opening 42 is disposed between the second insulating part 52 and the third insulating part 53.

One part 21a of the first conductive part 21 extends onto one part 51a of the first insulating part 51. Another part 21b of the first conductive part 21 extends onto one part 53a of the third insulating part 53. One part 22a of the second conductive part 22 extends onto one part 52a of the second insulating part 52. Another part 22b of the second conductive part 22 extends onto another part 53b of the third insulating layer 53. As described above, the first conductive part 21 and the second conductive part 22 extend onto each of two insulating parts 40b adjacent in the X-axis direction. As a result, the first light emitting part 31 and the second light emitting part 32 can be more appropriately covered.

One part 31a of the first light emitting part 31 extends between one part 51a of the first insulating part 51 and one part 21a of the first conductive part 21. Another part 31b of the first light emitting part 31 extends between one part 53a of the third insulating part 53 and another part 21b of the first conductive part 21. One outer edge 31c extending in the Y-axis direction of the first light emitting part 31 is covered with one part 21a of the first conductive part 21. Another outer edge 31d extending in the Y-axis direction of the first light emitting part 31 is covered with another part 21b of the first conductive part 21.

One part 32a of the second light emitting part 32 extends between one part 52a of the second insulating part 52 and one part 22a of the second conductive part 22. Another part 32b of the second light emitting part 32 extends between another part 53b of the third insulating part 53 and another part 22b of the second conductive part 22. One outer edge 32c extending in the Y-axis direction of the second light emitting part 32 is covered with one part 22a of the second conductive part 22. Another outer edge 32d extending in the Y-axis direction of the second light emitting part 32 is covered with another part 22b of the second conductive part 22.

As a result, for example, a displacement between the light emitting part 30e and the opening 40a and the shortening between the first electrode 10 and the second electrode 20 through the opening 40a in patterning the light emitting part 30e can be suppressed.

The light emitting part 30e is electrically connected to the first electrode 10 through the opening 40a. The light emitting part 30e is in contact with the first electrode 10 through the opening 40a, for example. Moreover, the light emitting part 30e is electrically connected to the second electrode 20. The light emitting part 30e is in contact with the conductive part 20c, for example. As a result, electric current is fed into the organic light emitting layer 30 using the first electrode 10 and the second electrode 20, and the organic light emitting layer 30 emits light. When electric current flows into the organic light emitting layer 30, an electron and a hole are recombined to produce an exciter, for example. The organic light emitting layer 30 emits light utilizing the radiation of light during radiative deactivation of the exciter, for example. In the specification, "being electrically connected to" includes "another electrical conductive member being interposed in between" other than "being directly in contact with".

As a result, in the organic electroluminescent device 110, a portion of the light emitting part 30e, the portion facing a portion exposed by the opening 40a of the first electrode 10, serves as an emission area EA. Electroluminescence EL generated from the emission area EA is emitted to the outside of the organic electroluminescent device 110 through the first electrode 10. A part of the electroluminescence EL is reflected by the second electrode 20, and is then emitted outside through the organic light emitting layer 30 and first electrode 10. That is, the organic electroluminescent device 110 is of a single-sided light-emitting type.

Moreover, in the organic electroluminescent device 110, outside light OL incident from the outside transmits through the insulating part 40b and first electrode 10 between each of the plurality of conductive parts 20c. As described above, the organic electroluminescent device 110 causes the outside light OL, which is incident upon the organic electroluminescent device 110 from the outside, to transmit therethrough while emitting the electroluminescence EL. As described above, the organic electroluminescent device 110 has light permeability in a turn-off state. Moreover, also in the turn-on state, the organic electroluminescent device 110 has light permeability when observed from the second electrode 20 side. As a result, in the organic electroluminescent device 110, an image in the background is visible through the organic electroluminescent device 110. That is, the organic electroluminescent device 110 is a see-through type filmy or tabular light source.

As described above, the organic electroluminescent device 110 of the embodiment can provide a light transmissive organic electroluminescent device. When the organic electroluminescent device 110 is applied to an illumination apparatus, the function to cause an image in the background to transmit therethrough, other than an illuminating function, allows for various new applications.

In the light transmissive organic electroluminescent device, a plurality of conductive parts may be provided on one continuous organic light emitting layer. In such a configuration, a part of the organic light emitting layer is exposed between each of the plurality of conductive parts, and the emission area of the organic light emitting layer might degrade due to the moisture and the like infiltrated from this part. In the light transmissive organic electroluminescent device, the width (length in the X-axis direction) of the emission area is narrow, and thus the effect of degradation of the emission area tends to become especially conspicuous. For example, luminance will decrease.

On the other hand, in the light transmissive organic electroluminescent device, the width of the conductive part is attempted to be reduced further so that an image in the background can be excellently observed while suppressing the visibility of the conductive part itself. However, if the width of the conductive part is reduced, the width of the emission area will decrease to further increase the effect of the degradation of the emission area. Therefore, in the organic electroluminescent device, it is desired to suppress the infiltration of moisture and the like into the organic light emitting layer 30.

In contrast, in the organic electroluminescent device 110 according to the embodiment, the plurality of light emitting parts 30e are provided in the organic light emitting layer 30. Then, each of the light emitting parts 30e is covered with the conductive part 20c. For example, a surface facing a side opposite the first electrode 10 of the light emitting part 30e is covered with the conductive part 20c. A surface facing the first electrode 10 side of the light emitting part 30e is covered with the first electrode 10 and the insulating layer 40. The outer edge extending in the Y-axis direction of the light emitting part 30e is covered with the conductive part 20c. As a result, in the organic electroluminescent device 110, the infiltration of moisture and the like into the organic light emitting layer 30 can be suppressed. For example, the degradation of the organic light emitting layer 30 due to moisture and the like can be suppressed. Even when the width of the conductive part 20c is reduced, a decrease of the luminance of the organic light emitting layer 30 can be suppressed. An excellent image in the background can be observed.

Figure 3:
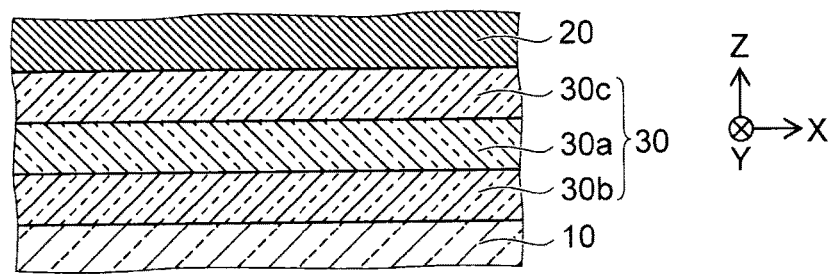
FIG. 3 is a schematic cross-sectional view showing a part of the organic electroluminescent device according to the first embodiment.

FIG. 3 is a schematic cross-sectional view showing a part of the organic electroluminescent device according to the first embodiment.

As shown in FIG. 3, the organic light emitting layer 30 (light emitting part 30e) includes a first layer 30a. The organic light emitting layer 30 can further include at least any one of a second layer 30b and a third layer 30c, as required. The first layer 30a emits light having a wavelength of visible light. The second layer 30b is provided between the first layer 30a and the first electrode 10. The third layer 30c is provided between the first layer 30a and the second electrode 200.

For the first layer 30a, the materials, such as $Alq_3$ (tris(8-hydroxyquinolinolato)aluminum), F8BT (poly(9,9-dioctylfluorene-co-benzothiadiazole) and PPV (polyparaphenylene-vinylene), can be used, for example. For the first layer 30a, a mixed material of a host material and a dopant added into the host material can be used. As the host material, for example CBP (4,4'-N,N'-bisdicarbazolyl-biphenyl), BCP (2,9-dimethyl-4,7 diphenyl-1,10-phenanthroline), TPD (4,4'-bis-N-3-methylphenyl-N-phenylaminobiphenyl), PVK (polyvinylcarbazole), PPT (poly(3-phenylthiophene)), or the like can be used. As the dopant material, for example Flrpic (iridium(III)bis(4,6-di-fluorophenyl)-pyridinate-N, C2'-picolinate), $Ir(ppy)_3$ (tris(2-phenylpyridine)iridium), Flr6 (bis(2,4-difluorophenylpyridinate)-tetrakis(1-pyrazolyl)borate-iridium(III)), or the like can be used. The material of the first layer 30a is not limited to these materials.

The second layer 30b functions as a hole injection layer, for example. For the hole injection layer, a material containing at least any one of PEDPOT: PPS (poly(3,4-ethylenedioxythiophene)-poly(styrenesulfonicacid)), CuPc (copper phthalocyanine), $MoO_3$ (molybdenum trioxide), and the like can be used, for example. The second layer 30b functions as a hole transport layer, for example. For the hole transport layer, a material containing at least any one of α-NPD (4,4'-bis[N-(1-naphthyl)-N-phenylamino]biphenyl), TAPC (1,1-bis[4-[N,N-di(p-tolyl)amino]phenyl]cyclohexane), m-MTDATA (4,4',4''-tris[phenyl(m-tolyl)amino]triphenylamine), TPD (bis(3-methylphenyl)-N,N'-diphenylbenzidine), TCTA (4,4',4''-tri(N-carbazolyl)triphenylamine), and the like can be used, for example. The second layer 30b may include, for example, a stacked structure of a layer functioning as the hole injection layer and a layer functioning as the hole transport layer. The second layer 30b may include a layer different from the layer functioning as the hole injection layer and from the layer functioning as the hole transport layer. The material of the second layer 30b is not limited to these materials.

The third layer 30c can include, for example, a layer functioning as an electron injection layer. For the electron injection layer, a material containing at least any one of lithium fluoride, cesium fluoride, lithium quinoline complex, and the like can be used, for example. The third layer 30c can include, for example, a layer functioning as an electron transport layer. For the electron transport layer, a material containing at least any one of $Alq_3$ (tris(8-quinolinolato)aluminum(III)), BAlq (bis(2-methyl-8-cunilate)(p-phenylphenolate)aluminum), Bphen (bathophenanthroline), 3TPYMB (tris[3-(3-pyridyl)-mesityl]borane), and the like, can be used, for example. The third layer 30c may include, for example, a stacked structure of a layer functioning as the electron injection layer and a layer functioning as the electron transport layer. The third layer 30c may include a layer different from a layer functioning as the electron injection layer and from a layer functioning as the electron transport layer. The material of the third layer 30c is not limited to these materials.

For example, the light radiated from the organic light emitting layer 30 is substantially white light. That is, the light emitted from the organic electroluminescent device 110 is white light. Here, the "white light" is substantially white, and includes, for example, reddish, yellowish, greenish, bluish, and/or purplish white light, as well.

The first electrode 10 includes an oxide that contains at least any one element selected from the group consisted of In, Sn, Zn, and Ti, for example. For the first electrode 10, for example a film (e.g., NESA or the like) fabricated using a conductive glass containing, indium oxide, zinc oxide, tin oxide, indium tin oxide (ITO: Indium Tin Oxide), fluorine-doped tin oxide (FTO), or indium zinc oxide, and gold, platinum, silver, copper, or the like can be used. The first electrode 10 functions as an anode, for example. The material of the first electrode 10 is not limited to these materials.

The second electrode 20 contains at least any one of aluminum and silver, for example. For example, an aluminum film is used for the second electrode 20. Furthermore, an alloy of silver and magnesium may be used for the second electrode 20. Calcium may be added into this alloy. The second electrode 20 functions as a cathode, for example. The material of the second electrode 20 is not limited to these materials.

The first electrode 10 may be set to the cathode and the second electrode 20 may be set to the anode, so that the second layer 30b may be caused to function as the electron injection layer or electron transport layer and the third layer 30c may be caused to function as the hole injection layer or hole transport layer.

The second electrode 20 may be light transmissive. As a result, the organic electroluminescent device 110 can be made an organic electroluminescent device of a double-sided light emitting type. When the second electrode 20 is made light transmissive, the materials described with respect to the first electrode 10 can be used for the second electrode 20, for example. Moreover, for the light transmissive second electrode 20, a metallic material, such as MgAg, may be used, for example. In the metallic material, the thickness of the second electrode 20 is set not less than 5 nm and not more than 20 nm. As a result, an appropriate light permeability can be obtained.

An insulating resin material, such as a polyimide resin or an acrylic resin, or an insulative inorganic material, such as a silicone oxide film (e.g., $SiO_2$), a silicon nitride film (e.g., SiN), or a silicon oxynitriding film, is used for the insulating layer 40, for example. The material of the insulating layer 40 is not limited to these materials.

The thickness (the length of the Z-axis direction) of the first electrode 10 is not less than 10 nm and not more than 1 μm, for example. The thickness of the insulating part 40b is not less than 100 nm and not more than 100 μm, for example. The thickness of the organic light emitting layer 30 (light emitting part 30e) is not less than 20 nm and not more than 500 nm, for example. The thickness of the second electrode 20 (conductive part 20c) is not less than 10 nm and nor more than 1 μm, for example. A width W1 (length in the X-axis direction) of the conductive part 20c is not less than 1 μm and not more than 2000 μm, for example. A width W2 of the light emitting part 30e is not less than 1 μm and not more than 2000 μm, for example. A width W3 of the emission area EA is not less than 1 μm and not more than 2000 μm, for example. A distance D1 in the X-axis direction between an outer edge extending in the Y-axis direction of the conductive part 20c and an outer edge extending in the Y-axis direction of the light emitting part 30e is not less than 1 μm and not more than 2000 μm, for example. A pitch Pt of each of the plurality of conductive parts 20c is not less than 50 μm and not more than 5000 μm, for example. The pitch Pt is the distance in the X-axis direction between the centers in the X-axis direction of the adjacent two conductive parts 20c, for example. In the above-described numerical value ranges, the relationship of W1>W2>W3 is established, for example. Furthermore, at least the relationship of Pt>W1 is established.

FIGS. 4A to 4D are the schematic plan views showing a part of the organic electroluminescent device according to the first embodiment.

Figure 4A:
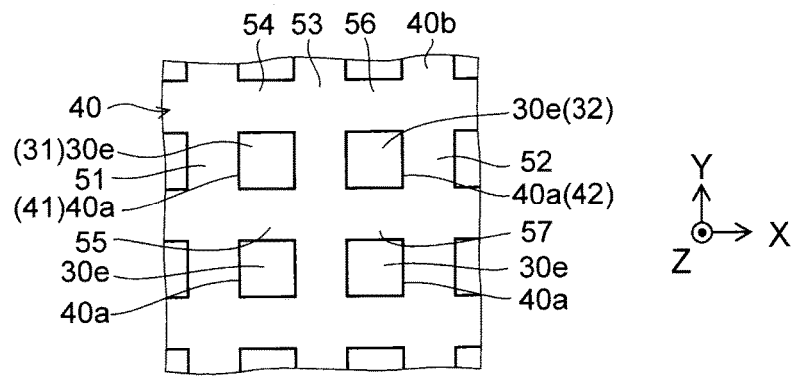
FIGS. 4A to 4D are the schematic plan views showing a part of the organic electroluminescent device according to the first embodiment.

As shown in FIG. 4A, in this example, the insulating layer 40 includes a plurality of rectangular openings 40a provided in a two-dimensional matrix, and a grid-shaped insulating part 40b.

In this example, the insulating layer 40 includes a first insulating part 51 to a seventh insulating part 57. Each of the first insulating part 51 to the seventh insulating part 57 is a part of the grid-shaped insulating part 40b. The first insulating part 51 extends in the Y-axis direction. The second insulating part 52 extends in the Y-axis direction, and is spaced apart from the first insulating part 51 in the X-axis direction. The third insulating part 53 extends in the Y-axis direction, and is disposed between the first insulating part 51 and the second insulating part 52. The fourth insulating part 54 is disposed between the first insulating part 51 and the third insulating part 53, extends in the X-axis direction, and has one end in contact with the first insulating part 51 and other end in contact with the third insulating part 53. The fifth insulating part 55 is spaced apart from the fourth insulating part 54 in the Y-axis direction, is disposed between the first insulating part 51 and the third insulating part 53, extends in the X-axis direction, and has one end in contact with the first insulating part 51 and other end in contact with the third insulating part 53. The sixth insulating part 56 is disposed between the second insulating part 52 and the third insulating part 53, extends in the X-axis direction, and has one end in contact with the second insulating part 52 and other end in contact with the third insulating part 53. The seventh insulating part 57 is spaced from the sixth insulating part 56 in the Y-axis direction, is disposed between the second insulating part 52 and the third insulating part 53, extends in the X-axis direction, and has one end in contact with the second insulating part 52 and other end in contact with the third insulating part 53. As described above, each of the first insulating part 51 to the third insulating part 53 may continue through the fourth insulating part 54 to the seventh insulating part 57.

The first opening 41 is disposed between the first insulating part 51 and the third insulating part 53 and is also disposed between the fourth insulating part 54 and the fifth insulating part 55. The second opening 42 is disposed between the second insulating part 52 and the third insulating part 53 and is also disposed between the sixth insulating part 56 and the seventh insulating part 57.

In this example, the pattern shape of the insulating layer 40 is grid-shaped. As described above, the pattern shape of the insulating layer 40 may be stripe-shaped, or may be grid-shaped. The pattern shape of the insulating layer 40 may be a honeycomb shape or the like. The shape projected onto an X-Y plane (plane parallel to the upper face 10a) of each of the plurality of openings 40a arranged in a two-dimensional matrix is not limited to a rectangular shape, but may be a circle, other polygonal shape, or the like.

Moreover, the insulating layer 40 may include, for example, the grid-shaped opening 40a and the plurality of insulating part 40b provided in a two-dimensional matrix. The first opening 41 and the second opening 42 may be continuous.

When the insulating layer 40 is grid-shaped, the light emitting part 30e is provided on each part of the first electrode 10 exposed by each of the plurality of openings 40a. That is, in this example, a plurality of rectangular light emitting parts 30e are arranged in a two-dimensional matrix, the plurality of rectangular light emitting parts 30e each corresponding to each of the plurality of openings 40a.

Figure 4B:
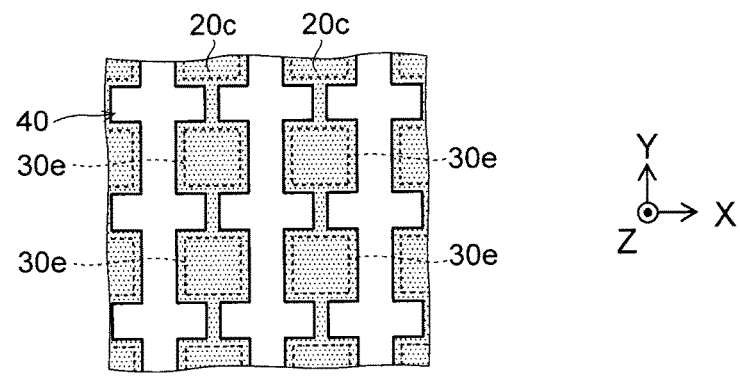

When the opening 40a of the insulating layer 40 is formed in a rectangular shape, in the second electrode 20, for example, as shown in FIG. 4B, a plurality of conductive parts 20c extending in the Y-axis direction and arranged in the X-axis direction are provided, and one conductive part 20c is provided on each of the plurality of light emitting parts 30e arranged in the Y-axis direction. In this case, as shown in FIG. 4B, the width of a portion between each light emitting part 30e is made narrower than the width of a portion where the former portion overlaps with each light emitting part 30e. As a result, for example, light permeability can be increased. One organic light emitting layer 30 may be provided for each one light emitting part 30e. That is, the organic light emitting layer 30 may be provided so that the outer edge thereof is located outside each light emitting part 30e and also inside the conductive part 20c. Alternatively, one organic light emitting layer 30 may be provided for every plurality of light emitting parts 30e arranged in the Y-direction. That is, the organic light emitting layer 30 may be provided so that the outer edge thereof is located outside the plurality of light emitting parts 30e and also inside the conductive part 20c.

Figure 4C:
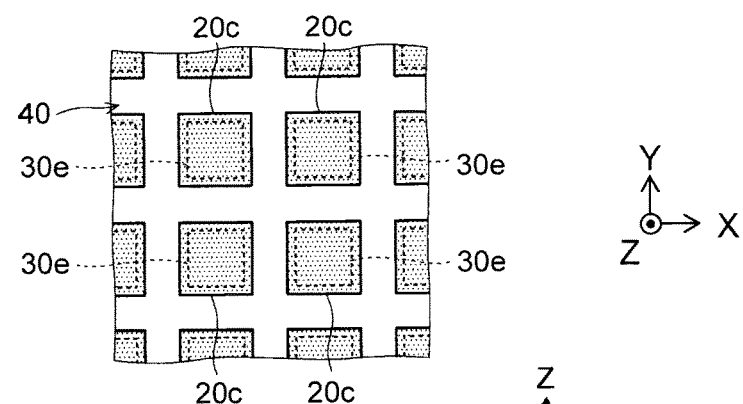

As shown in FIG. 4C, each of the plurality of conductive parts 20c may be provided on each of the plurality of light emitting parts 30e. In this case, the shape of the conductive part 20c projected onto the X-Y plane may correspond to the shape of the light emitting part 30e projected onto the X-Y plane.

Figure 4D:
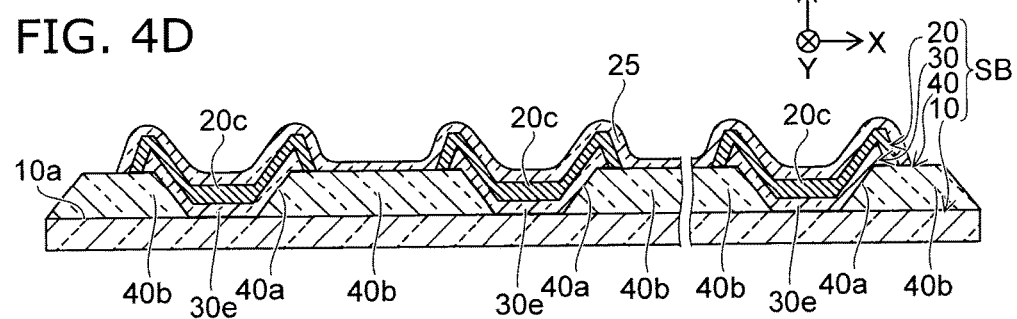

As shown in FIG. 4D, when each of the plurality of conductive parts 20c is provided on each of the plurality of light emitting parts 30e, a light transmissive conductive film 25 for electrically connecting to each of the plurality of conductive parts 20c is provided on each conductive part 20c, for example. As a result, for example a voltage can be efficiently applied to each of the plurality of conductive parts 20c. For the conductive film 25, the materials described with respect to the first electrode 10 can be used, for example.

Furthermore, one grid-shaped conductive part 20c may be provided on each of the plurality of light emitting parts 30e. The first conductive part 21 and the second conductive part 22 may be continuous. Then, one organic light emitting layer 30 may be provided for every plurality of light emitting parts 30e arranged in the Y-direction. That is, the organic light emitting layer 30 may be provided so that the outer edge thereof is located outside the plurality of light emitting parts 30e and is also located inside the conductive part 20c.

Figure 5:
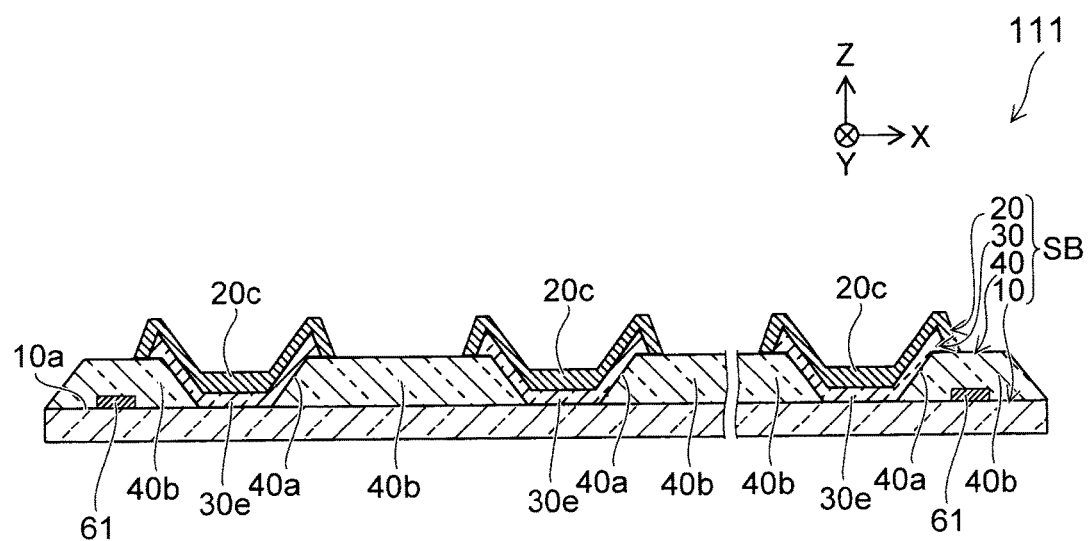
FIG. 5 is a schematic cross-sectional view showing another organic electroluminescent device according to the first embodiment.

FIG. 5 is a schematic cross-sectional view showing another organic electroluminescent device according to the first embodiment.

As shown in FIG. 5, the stacked body SB of the organic electroluminescent device 111 further includes a wiring layer 60.

The wiring layer 60 extends along a plane parallel to the upper face 10a. That is, the wiring layer 60 extends in the X-Y plane. In this example, the wiring layer 60 is provided on the upper face 10a of the first electrode 10. The wiring layer 60 is provided between the first electrode 10 and the insulating layer 40, for example. The wiring layer 60 may be provided on a surface opposite the upper face 10a of the first electrode 10.

The wiring layer 60 includes a conductive wiring part 61. The wiring layer 60 includes a plurality of wiring parts 61, for example. The wiring part 61 is provided between the first electrode 10 and the insulating part 40b. Each of the plurality of wiring parts 61 extends in the Y-axis direction, and is spaced apart from each other in the X-axis direction, for example. The interval of each of the plurality of wiring parts 61 is constant, for example. Moreover, the interval of each of the plurality of wiring parts 61 is wider than the interval of each of the plurality of conductive parts 20c, for example. In this example, the pattern shape of the wiring layer 60 is stripe-shaped. The pattern shape of the wiring layer 60 may be grid-shaped, or may be honeycomb-shaped, for example. The wiring layer 60 exposes a part of the first electrode 10. In other words, the wiring layer 60 includes one or more openings for exposing a part of the first electrode 10.

The wiring layer 60 is electrically connected to the first electrode 10. The wiring layer 60 is in contact with the first electrode 10, for example. The conductivity of the wiring layer 60 is higher than the conductivity of the first electrode 10. The wiring layer 60 has light reflectivity. The light reflectance of the wiring layer 60 is higher than the light reflectance of the first electrode 10. The wiring layer 60 is metal wirings, for example. The wiring layer 60 functions as an auxiliary electrode that transmits the electric current flowing into the first electrode 10, for example. As a result, in the organic electroluminescent device 111, for example the amount of current flowing in the direction parallel to the upper face 10a of the first electrode 10 can be made uniform as compared with the organic electroluminescent device 110. For example, the in-plane emission luminance can be made more uniform.

The wiring layer 60 contains at least any one element selected from the group consisted of Mo, Ta, Nb, Al, Ni, and Ti, for example. The wiring layer 60 can be a mixed film containing the elements selected from this group, for example. The wiring layer 60 can be a stacked film containing these elements. For the wiring layer 60, a stacked film of Nb/Mo/Al/Mo/Nb can be used, for example. The wiring layer 60 functions as an auxiliary electrode for suppressing a drop in the potential of the first electrode 10, for example. The wiring layer 60 can function as a lead electrode for supplying electric current. The material of the wiring layer 60 is not limited to these materials.

Figure 6:
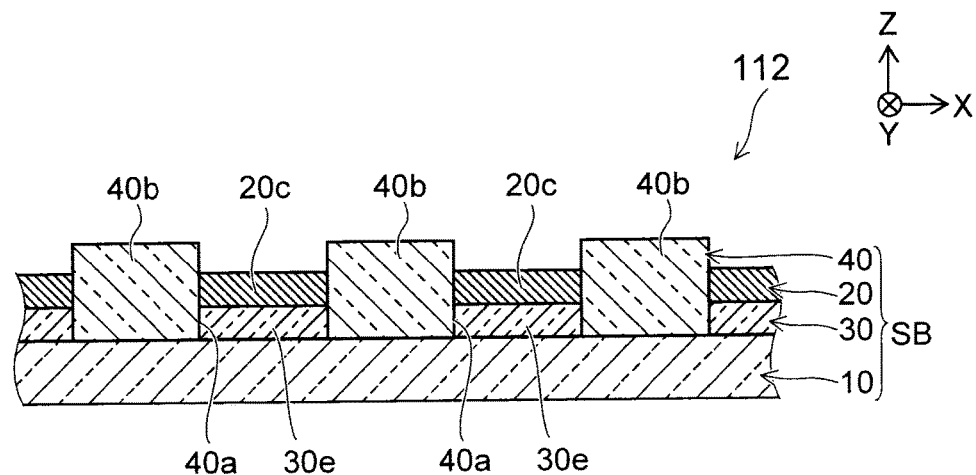
FIG. 6 is a schematic cross-sectional view showing another organic electroluminescent device according to the first embodiment.

FIG. 6 is a schematic cross-sectional view showing another organic electroluminescent device according to the first embodiment.

As shown in FIG. 6, in an organic electroluminescent device 112, each of the plurality of conductive parts 20c does not extend onto the insulating layer 40. Then, each of the plurality of light emitting parts 30e does not extend onto the insulating layer 40. As described above, the conductive part 20c and light emitting part 30e do not necessarily need to extend onto the insulating layer 40.

In the organic electroluminescent device 112, a surface on the opposite side of the first electrode 10 of the light emitting part 30e is covered with the conductive part 20c. A surface on the first electrode 10 side of the light emitting part 30e is covered with the first electrode 10. Then, a pair of outer edges (side surfaces) extending in the Y-axis direction of the light emitting part 30e is covered with the adjacent insulating parts 40b. As a result, also in the organic electroluminescent device 112, the infiltration of moisture and the like into the organic light emitting layer 30 can be suppressed.

Figure 7:
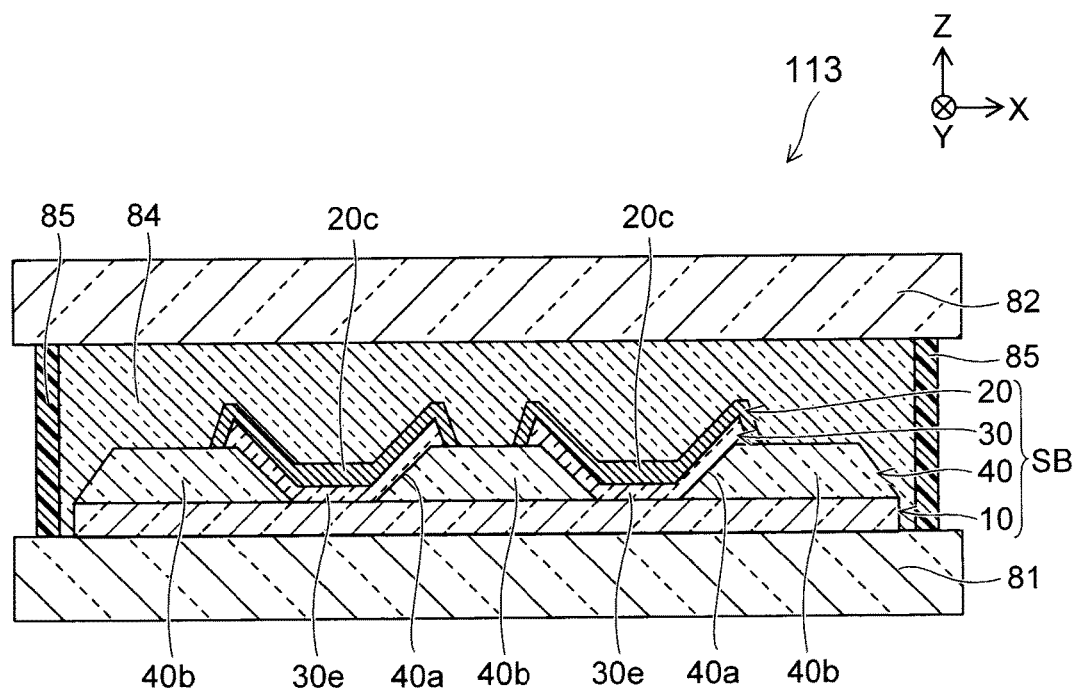
FIG. 7 is a schematic cross-sectional view showing another organic electroluminescent device according to the first embodiment.

FIG. 7 is a schematic cross-sectional view showing another organic electroluminescent device according to the first embodiment.

As shown in FIG. 7, an organic electroluminescent device 113 further includes a first substrate 81, a second substrate 82, an intermediate layer 84, and a seal part 85.

The first electrode 10 is provided on the first substrate 81. The stacked body SB is provided on the first substrate 81. The first substrate 81 has light permeability. The second substrate 82 is provided on the stacked body SB, and faces the first substrate 81. The second substrate 82 has light permeability.

The intermediate layer 84 is provided between the stacked body SB and the second substrate 82. The intermediate layer 84 is filled into a space between the first substrate 81 and the second substrate 82, for example. The intermediate layer 84 has light permeability. The intermediate layer 84 has at least one of hygroscopicity and oxygen adsorptivity. The intermediate layer 84 may be in the form of gas, liquid, solid, or gel. The intermediate layer 84 is a light transmissive organic sealant, for example.

The seal part 85 is annularly provided along the outer edges of the first substrate 81 and the second substrate 82 and bonds the first substrate 81 and the second substrate 82. As a result, the stacked body SB is sealed by the first substrate 81 and the second substrate 82. In the organic electroluminescent device 113, the distance in the Z-axis direction between the first substrate 81 and the second substrate 82 is defined by the seal part 85. This configuration can be realized, for example, by including a granular spacer (the illustration is omitted) in the seal part 85. For example, a plurality of granular spacers are distributed in the seal part 85, so that the distance between the first substrate 81 and the second substrate 82 is defined by the diameters of the plurality of spacers.

In the organic electroluminescent device 113, the side surface of the intermediate layer 84 is covered with the seal part 85. In the organic electroluminescent device 113, the thickness (length along the Z-axis direction) of the seal part 85 is not less than 5 μm and not more than 100 μm, for example, and more preferably, not less than 10 μm and not more than 20 μm, for example. As a result, for example, the infiltration of moisture and the like can be suppressed. The thickness of the seal part 85 is substantially the same as the diameter of the spacer distributed in the seal part 85, for example.

In the organic electroluminescent device, a recessed portion for housing the stacked body SB may be provided in the second substrate 82. This configuration makes the formation of the second substrate 82 difficult. For example, this configuration will increase the cost of the organic electroluminescent device.

In contrast, in the organic electroluminescent device 113 according to the embodiment, the distance between the first substrate 81 and the second substrate 82 is defined by the seal part 85. As a result, a tabular second substrate 82 can be used, for example. The second substrate 82 can be easily formed, for example. An increase in cost of the organic electroluminescent device 113 can be suppressed.

Moreover, the thermal conductivity of the intermediate layer 84 is higher than the thermal conductivity of inert gas, such as $N_2$ and Ar, for example. Therefore, the radiation efficiency of the heat generated in association with the emission of the light emitting part 30e can be increased, for example, as compared with not only a case where a hollow layer is vacuum and but also a case where the hollow layer is filled with inert gas, such as $N_2$ or Ar.

In the organic electroluminescent device 113, the light emitting part 30e is covered with the conductive part 20c. As a result, for example also when a liquid intermediate layer 84 or the like is used, the degradation of the light emitting part 30e due to the intermediate layer 84 can be suppressed. In the organic electroluminescent device 113, the penetration of the intermediate layer 84 into the organic light emitting layer 30 can be also suppressed. Moreover, the intermediate layer 84 has at least one of hygroscopicity and oxygen adsorptivity. As a result, the infiltration of moisture into the organic light emitting layer 30 can be more appropriately suppressed. The space between the stacked body SB and the second substrate 82 may be an inert-gas layer of $N_2$, Ar, or the like. In this case, a drying agent or the like may be provided between the stacked body SB and the second substrate 82.

Moreover, in the organic electroluminescent device 113, the intermediate layer 84 is provided between the stacked body SB and the second substrate 82. As a result, the strength of the organic electroluminescent device 113 can be increased as compared with a case where the portion between the stacked body SB and the second substrate 82 is a hollow layer, for example. As a result, the distance in the Z-axis direction between the first substrate 81 and the second substrate 82 can be reduced as compared with the case where the portion between the stacked body SB and the second substrate 82 is a hollow layer, for example. For example, a reduction in thickness of the organic electroluminescent device 113 can be achieved.

For the first substrate 81 and the second substrate 82, a glass substrate or a resin substrate is used, for example. For the seal part 85, an ultraviolet curing resin or the like is used, for example.

Figure 8:
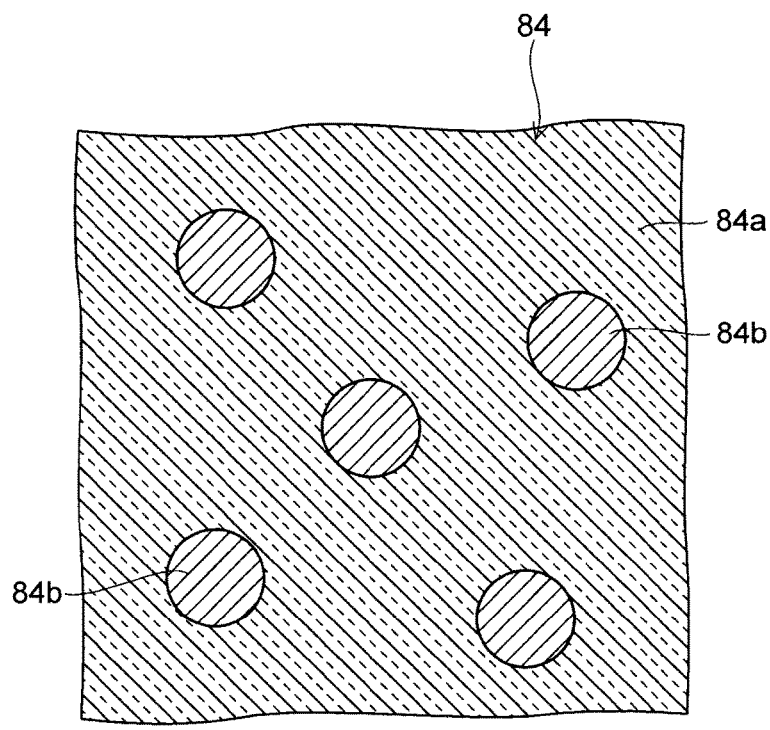
FIG. 8 is a schematic cross-sectional view showing a part of another organic electroluminescent device according to the first embodiment.

FIG. 8 is a schematic cross-sectional view showing a part of another organic electroluminescent device according to the first embodiment.

As shown in FIG. 8, the intermediate layer 84 includes a resin part 84a and an additive agent 84b distributed into the resin part 84a, for example. For the resin part 84a, a polymer resin, such as an acrylic resin or a triazine resin, is used, for example. For the additive agent 84b, calcium oxide, silica, or barium oxide is used, for example. However, when the hygroscopicity is desired to be improved by increasing the amount of the additive agent, the hygroscopicity is a trade-off with the light permeability, and therefore a moisture absorbing material containing a transparent-liquid organometallic complex or a gel organometallic complex as a principal component may be used for the intermediate layer 84, for example. As a result, the stacked body SB can be more appropriately protected from moisture without sacrificing the light permeability, for example.

(Second Embodiment)

Figure 9:
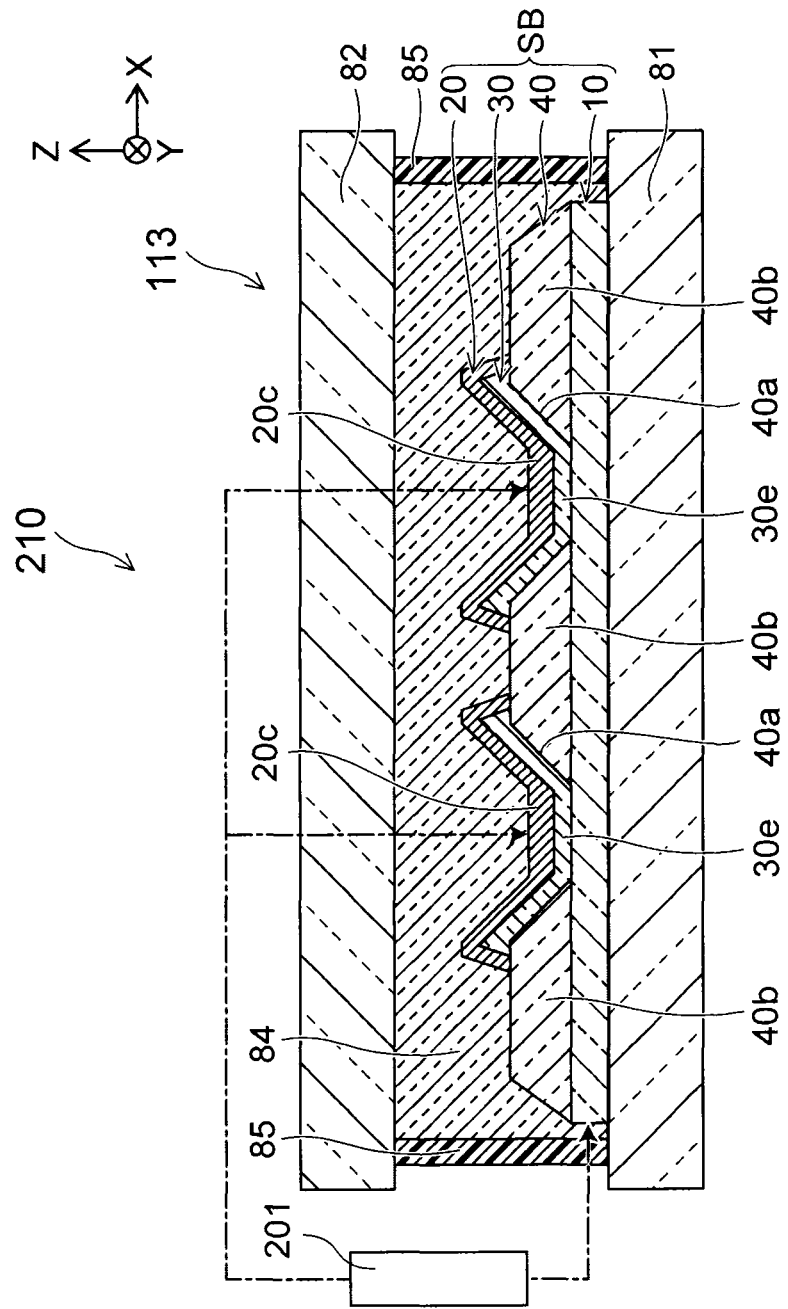
FIG. 9 is a schematic view showing an illumination apparatus according to a second embodiment.

FIG. 9 is a schematic view showing an illumination apparatus according to a second embodiment.

As shown in FIG. 9, an illumination apparatus 210 according to the embodiment includes the organic electroluminescent device (e.g., organic electroluminescent device 113) according to the first embodiment, and a power source 201.

The power source 201 is electrically connected to the first electrode 10 and the second electrode 20. The power source 201 supplies electric current to the organic light emitting layer 30 through the first electrode 10 and the second electrode 20. The illumination apparatus 210 according to the embodiment can provide an illumination apparatus that suppresses the infiltration of moisture and the like into the organic light emitting layer 30.

Third Embodiment

Figure 10A:
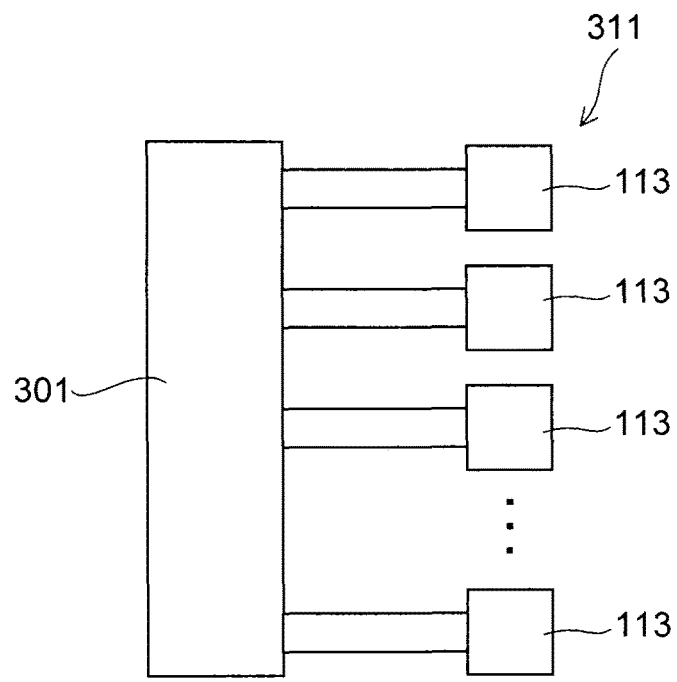
FIGS. 10A and 10B are schematic views showing an illumination system according to a third embodiment.
Figure 10B:
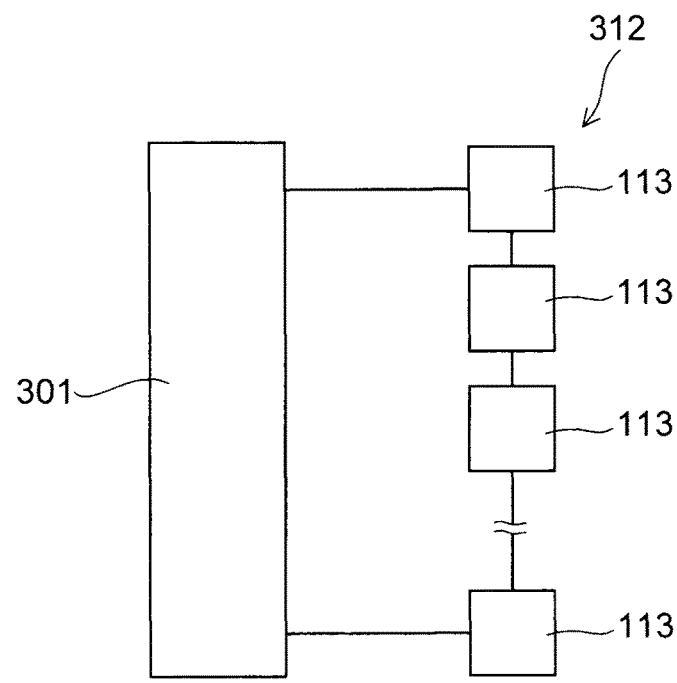

FIGS. 10A and 10B are schematic views showing an illumination system according to a third embodiment.

As shown in FIG. 10A, an illumination system 311 according to the embodiment includes a plurality of organic electroluminescent devices (e.g., organic electroluminescent devices 113) according to the first embodiment, and a controller 301.

The controller 301 is electrically connected to each of the plurality of organic electroluminescent devices 113, and controls to turn-on and turn-off each of the plurality of organic electroluminescent devices 113. The controller 301 is electrically connected to the first electrode 10 and second electrode 20 of each of the plurality of organic electroluminescent devices 113, for example. As a result, the controller 301 individually controls to turn-on and turn-off each of the plurality of organic electroluminescent devices 113.

As shown in FIG. 10B, in an illumination system 312, each of the plurality of organic electroluminescent devices 113 is connected in series. The controller 301 is electrically connected to the first electrode 10 of one organic electroluminescent device 113 of the plurality of organic electroluminescent devices 113. Then, the controller 301 is electrically connected to the second electrode 20 of another organic electroluminescent device 113 of the plurality of organic electroluminescent devices 113. As a result, the controller 301 collectively controls to turn-on and turn-off each of the plurality of organic electroluminescent devices 113. As described above, the controller 301 may individually control to turn-on and turn-off each of the plurality of organic electroluminescent devices 113, or may collectively control the plurality of organic electroluminescent devices 113.

The illumination systems 311 and 312 according to the embodiment can provide an illumination system that suppresses the infiltration of moisture and the like into the organic light emitting layer 30.

According to the embodiments, organic electroluminescent devices, illumination apparatuses, and illumination systems capable of suppressing the infiltration of moisture and the like into the organic light emitting layer are provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the embodiments of the invention are not limited to these specific examples. For example, one skilled in the art may similarly practice the invention by appropriately selecting specific configurations of components included in organic electroluminescent devices, illumination apparatuses, and illumination systems such as first electrodes, second electrodes, organic light emitting layers, insulating layers, stacked bodies, first substrates, second substrates, intermediate layers, power sources, controllers, etc., from known art; and such practice is included in the scope of the invention to the extent that similar effects are obtained.

Further, any two or more components of the specific examples may be combined within the extent of technical feasibility and are included in the scope of the invention to the extent that the purport of the invention is included.

Moreover, all organic electroluminescent devices, illumination apparatuses, and illumination systems practicable by an appropriate design modification by one skilled in the art based on the organic electroluminescent devices, illumination apparatuses, and illumination systems described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An organic electroluminescent device, comprising:
   a first substrate having light permeability;
   a first electrode provided on the first substrate, the first electrode having light permeability;
   an insulating layer provided on the first electrode, the insulating layer including a first opening for exposing a part of the first electrode and a second opening for exposing another part of the first electrode, the insulating layer having light permeability;
   a second electrode including a first conductive part and a second conductive part, the first conductive part covering the first opening, the second conductive part being spaced apart from the first conductive part and covering the second opening;
   an organic light emitting layer including:
      a first light emitting part provided between the part of the first electrode and the first conductive part and surrounded by the first electrode, the insulating layer, and the first conductive part; and
      a second light emitting part spaced apart from the first light emitting part, provided between the another part of the first electrode and the second conductive part, and surrounded by the first electrode, the insulating layer, and the second conductive part;
   a second substrate provided on a stacked body, the stacked body including the first electrode, the insulating layer, the organic light emitting layer, and the second electrode, the second substrate facing the first substrate, the second substrate having light permeability;
   an intermediate layer provided between the stacked body and the second substrate, the intermediate layer having at least one of hygroscopicity and oxygen adsorptivity, the intermediate layer having light permeability; and
   a wiring layer electrically connected to the first electrode, a conductivity of the wiring layer being higher than a conductivity of the first electrode.

2. The device according to claim 1, wherein
   a part of the first conductive part extends onto a part of the insulating layer, and
   a part of the second conductive part extends onto another part of the insulating layer.

3. The device according to claim 2, wherein
a part of the first light emitting part extends between the part of the insulating layer and the part of the first conductive part,
a part of the second light emitting part extends between the another part of the insulating layer and the part of the second conductive part,
an outer edge of the first light emitting part is covered with the part of the first conductive part, and
an outer edge of the second light emitting part is covered with the part of the second conductive part.

4. The device according to claim 1, further comprising a seal part annularly provided along an outer edge of the first substrate and an outer edge of the second substrate, the seal part sealing the stacked body.

5. The device according to claim 4, wherein the intermediate layer is filled into a space between the first substrate and the second substrate.

6. The device according to claim 1, wherein
the first conductive part extends in a first direction parallel to an upper face of the first electrode,
the second conductive part extends in the first direction,
the second conductive part is spaced apart from the first conductive part in a second direction parallel to the upper face of the first electrode and perpendicular to the first direction, and
each of a length in the second direction of the first conductive part and a length in the second direction of the second conductive part is not less than 1 μm and not more than 2000 μm.

7. The device according to claim 1, wherein
the insulating layer includes:
- a first insulating part extending in a first direction parallel to an upper face of the first electrode;
- a second insulating part spaced apart from the first insulating part in a second direction parallel to the upper face of the first electrode and perpendicular to the first direction, the second insulating part extending in the first direction; and
- a third insulating part disposed between the first insulating part and the second insulating part, the third insulating part extending in the first direction, the first opening is disposed between the first insulating part and the third insulating part, and
the second opening is disposed between the second insulating part and the third insulating part.

8. The device according to claim 7, wherein each of a width in the second direction of the first insulating part, a width in the second direction of the second insulating part, and a width in the second direction of the third insulating part decreases in a direction from the first electrode to the second electrode.

9. The device according to claim 7, wherein
the insulating layer further includes:
- a fourth insulating part disposed between the first insulating part and the third insulating part, the fourth insulating part extending in the second direction and having one end in contact with the first insulating part and other end in contact with the third insulating part;
- a fifth insulating part spaced apart from the fourth insulating part in the first direction and disposed between the first insulating part and the third insulating part, the fifth insulating part extending in the second direction and having one end in contact with the first insulating part and other end in contact with the third insulating part;
- a sixth insulating part disposed between the second insulating part and the third insulating part, the sixth insulating part extending in the second direction and having one end in contact with the second insulating part and other end in contact with the third insulating part; and
- a seventh insulating part spaced apart from the sixth insulating part in the first direction and disposed between the second insulating part and the third insulating part, the seventh insulating part extending in the second direction and having one end in contact with the second insulating part and other end in contact with the third insulating part, the first opening is disposed between the fourth insulating part and the fifth insulating part, and
the second opening is disposed between the sixth insulating part and the seventh insulating part.

10. The device according to claim 1, wherein
the insulating layer includes a plurality of openings each exposing a part of the first electrode,
the openings are arranged in a first direction parallel to an upper face of the first electrode and are also arranged in a second direction parallel to the upper face and perpendicular to the first direction,
the organic light emitting layer includes a plurality of light emitting parts each being provided corresponding to each of the openings,
the second electrode includes a plurality of conductive parts, the conductive parts extend in the first direction and are arranged in the second direction,
the conductive parts overlaps with a group of the light emitting parts arranged in the first direction among the light emitting parts,
the first opening is one of the openings,
the second opening is another one of the openings,
the first light emitting part is one of the light emitting parts,
the second light emitting part is another one of the light emitting parts,
the first conductive part is one of the conductive parts, and
the second conductive part is another one of the conductive parts.

11. The device according to claim 10, wherein in each of the conductive parts, a width in the second direction of a portion between light emitting parts is narrower than a width in the second direction of a portion overlapping with the light emitting parts.

12. The device according to claim 1, wherein
the insulating layer includes a plurality of openings each exposing a part of the first electrode,
the openings are arranged in a first direction parallel to an upper face of the first electrode and are also arranged in a second direction parallel to the upper face and perpendicular to the first direction,
the organic light emitting layer includes a plurality of light emitting parts each being provided corresponding to each of the plurality of openings,
the second electrode includes a plurality of conductive parts and a conductive film,
each of the conductive parts overlaps with each of the light emitting parts,
the conductive film has light permeability and is electrically connected to each of the conductive parts,
the first opening is one of the openings,
the second opening is another one of the openings,
the first light emitting part is one of the light emitting parts, the second light emitting part is another one of the light emitting parts, the first conductive part is one of the conductive parts, and the second conductive part is another one of the conductive parts.

13. The device according to claim 1, wherein an outer edge of the first light emitting part and an outer edge of the second light emitting part are covered with the insulating layer.

14. The device according to claim 1, wherein a light radiated from the first light emitting part and the second light emitting part is white light.

15. The device according to claim 1, wherein the second electrode has light reflectivity.

16. The device according to claim 1, wherein the second electrode has light permeability.

17. An organic electroluminescent device, comprising:

a first substrate having light permeability;

a first electrode provided on the first substrate, the first electrode having light permeability;

an insulating layer provided on the first electrode, the insulating layer including a first opening for exposing a part of the first electrode and a second opening for exposing another part of the first electrode, the insulating layer having light permeability;

a second electrode including a first conductive part and a second conductive part, the first conductive part covering the first opening, the second conductive part being spaced apart from the first conductive part and covering the second opening;

an organic light emitting layer including:
a first light emitting part provided between the part of the first electrode and the first conductive part and surrounded by the first electrode, the insulating layer, and the first conductive part; and
a second light emitting part spaced apart from the first light emitting part, provided between the another part of the first electrode and the second conductive part, and surrounded by the first electrode, the insulating layer, and the second conductive part;

a second substrate provided on a stacked body, the stacked body including the first electrode, the insulating layer, the organic light emitting layer, and the second electrode, the second substrate facing the first substrate, the second substrate having light permeability; and an intermediate layer provided between the stacked body and the second substrate, the intermediate layer having at least one of hygroscopicity and oxygen adsorptivity, the intermediate layer having light permeability, the insulating layer includes a plurality of openings each exposing a part of the first electrode, the openings are arranged in a first direction parallel to an upper face of the first electrode and are also arranged in a second direction parallel to the upper face and perpendicular to the first direction, the organic light emitting layer includes a plurality of light emitting parts each being provided corresponding to each of the openings, the second electrode includes a plurality of conductive parts, the conductive parts extend in the first direction and are arranged in the second direction, the conductive parts overlaps with a group of the light emitting parts arranged in the first direction among the light emitting parts, the first opening is one of the openings, the second opening is another one of the openings, the first light emitting part is one of the light emitting parts, the second light emitting part is another one of the light emitting parts, the first conductive part is one of the conductive parts, the second conductive part is another one of the conductive parts, and in each of the conductive parts, a width in the second direction of a portion between light emitting parts is narrower than a width in the second direction of a portion overlapping with the light emitting parts.

* * * * *